(12) United States Patent
Burden

(10) Patent No.: US 6,867,459 B2
(45) Date of Patent: Mar. 15, 2005

(54) ISOTOPICALLY PURE SILICON-ON-INSULATOR WAFERS AND METHOD OF MAKING SAME

(75) Inventor: Stephen J. Burden, Golden, CO (US)

(73) Assignee: Isonics Corporation, Golden, CO (US)

( * ) Notice: Subject to any disclaimer, the term of this patent is extended or adjusted under 35 U.S.C. 154(b) by 0 days.

(21) Appl. No.: 10/189,732

(22) Filed: Jul. 3, 2002

(65) Prior Publication Data

US 2003/0013275 A1 Jan. 16, 2003

Related U.S. Application Data

(60) Provisional application No. 60/303,455, filed on Jul. 5, 2001.

(51) Int. Cl.[7] .............................................. H01L 27/01
(52) U.S. Cl. ........................ 257/347; 257/352; 257/616
(58) Field of Search ................................. 257/347, 352, 257/616

(56) References Cited

U.S. PATENT DOCUMENTS

| | | | |
|---|---|---|---|
| 5,144,409 A * | 9/1992 | Ma ............................ | 257/557 |
| 5,442,191 A | 8/1995 | Ma ................................. | 257/1 |
| 5,917,195 A | 6/1999 | Brown ......................... | 257/22 |
| 6,084,895 A | 7/2000 | Kouchi et al. ................. | 372/36 |
| 6,344,375 B1 | 2/2002 | Orita et al. ................... | 438/151 |
| 6,365,098 B1 | 4/2002 | Fulbright ..................... | 420/578 |
| 6,392,220 B1 * | 5/2002 | Slater et al. ................. | 250/216 |
| 6,661,065 B2 * | 12/2003 | Kunikiyo ..................... | 257/411 |

FOREIGN PATENT DOCUMENTS

| JP | 20002000069557 | 12/2000 |
|---|---|---|
| JP | 20002000007224 | 7/2001 |

OTHER PUBLICATIONS

Wolf, S., et al., Silicon Processing for the VLSI Era, vol. 1—Process Technology, Lattice Press, 1986, pp. 151–155.*

* cited by examiner

Primary Examiner—T. N. Quach
(74) Attorney, Agent, or Firm—Sheridan Ross P.C.

(57) ABSTRACT

The present invention provides improved semiconductor wafer structures having isotopically-enriched layers and methods of making the same.

5 Claims, 1 Drawing Sheet

ISOTOPICALLY PURE SILICON-ON-INSULATOR WAFERS AND METHOD OF MAKING SAME

CROSS-REFERENCE TO RELATED APPLICATIONS

This application claims the benefit of U.S. Provisional Application No. 60/303,455 filed Jul. 5, 2001, which is incorporated herein in its entirety by this reference.

FIELD OF THE INVENTION

The present invention relates to methods of making an improved semiconductor wafer structures having isotopically-enriched layers.

BACKGROUND OF THE INVENTION

Silicon on insulator (SOI) wafers are becoming an increasingly accepted form of silicon wafers for the manufacture of semiconductor devices. SOI wafers have a thin layer of silicon dioxide below the surface of the single crystal silicon wafer. This layer electrically isolates the surface layer from the bulk of the wafer and allows semiconductor devices to operate at higher speeds with lower power consumption. Thus, the wafer structure consists of a top single crystal silicon layer (the device layer), an amorphous silicon dioxide layer (the buried oxide or BOX layer), and a substrate or handle wafer. The handle wafer is typically a single crystal silicon wafer. A typical wafer structure is shown in FIG. 1 in which layer 1 is the top silicon layer, called the device layer wherein the semiconductor device is fabricated; layer 2 is the BOX or insulator layer; and layer 3 is the substrate.

Power dissipation in a semiconductor device is limited by the thermal conductivity of the materials from which it is made. This thermal conductivity in turn limits the packing density of the transistors on a semiconductor wafer or the amount of power that can be generated in a circuit without inducing circuit failure. Thus, one side effect of electrically isolating the top silicon layer with silicon dioxide is that the top layer is also thermally insulated from the silicon substrate. This accentuates the self-heating of circuits and can cause problems with high power devices such as microprocessors. Several designs have been proposed to overcome the detrimental effects of this thermal isolation including the use of local thermal paths to transport the heat through the oxide layer or the fabrication of a "partial" SOI wafer having areas of wafer without an oxide layer.

These designs are difficult and therefore expensive to implement. A novel solution provided by this invention is the use of high thermal conductivity silicon-28 in the manufacture of SOI wafers. By utilizing an isotopically-enriched silicon-28 device layer and/or an isotopically-enriched silicon-28 layer under the oxide, lateral heat spreading can be maximized. This is particularly true for thin-film SOI wafers where the top silicon layer is much less than one micron thick. With these wafers, the device layer can be natural silicon since the thermal transport in the device layer is controlled by interface scattering effects and not by the bulk properties of the silicon. In this case an underlayer of isotopically-enriched silicon helps greatly to spread the heat generated in the device layer. Silicon-28 can be incorporated without changing the device design and at relatively modest cost since the amount of silicon-28 in these thin layers is small. Fabricating isotopically modified SOI wafers allows for increased power densities in these devices, thereby enhancing the performance of many electronic devices now on the market.

SUMMARY OF THE INVENTION

Accordingly, the present invention provides improved semiconductor wafer structures having isotopically-enriched layers and methods of making such wafers. In one embodiment, the invention provides a method of producing a semiconductor wafer structure by forming an isotopically-enriched semiconductor material layer on one surface of an electrically-insulating material. The isotopically-enriched semiconductor material layer may be isotopically-enriched silicon, isotopically-enriched germanium, isotopically-enriched silicon-germanium alloys and combinations and alloys thereof. The electrically-insulating material may be silicon dioxide or silicon nitride.

In another embodiment of the present invention, the semiconductor wafer structure has an isotopically-enriched $^{28}$Si layer on top of a layer composed of $^{28}$SiO$_2$ or $^{28}$Si$_3$N$_4$ on top of an isotopically-enriched $^{28}$Si layer on top of a natural silicon substrate. The invention provides a method of making these wafers by forming an isotopically-enriched silicon semiconductor layer on one surface of a natural silicon substrate and implanting oxygen or nitrogen atoms into the isotopically-enriched silicon layer. The wafer is then annealed to form an isotopically-enriched $^{28}$Si layer on top of a layer having $^{28}$SiO$_2$ or $^{28}$Si$_3$N$_4$ on top of an isotopically-enriched $^{28}$Si layer on top of a natural silicon substrate.

Another embodiment of the present invention is a method of forming a wafer structure having an isotopically-enriched layer and an electrically-insulating layer by bonding together an electrically-insulating layer between two substrates, each substrate comprising a semiconductor layer formed on the surface of the substrate. At least one of the semiconductor layers is isotopically-enriched. The substrate may then be removed to form a semiconductor wafer comprising a semiconductor device layer on an electrically-insulating layer on an isotopically-enriched semiconductor layer on a substrate.

DETAILED DESCRIPTION OF THE INVENTION

Figure 1:
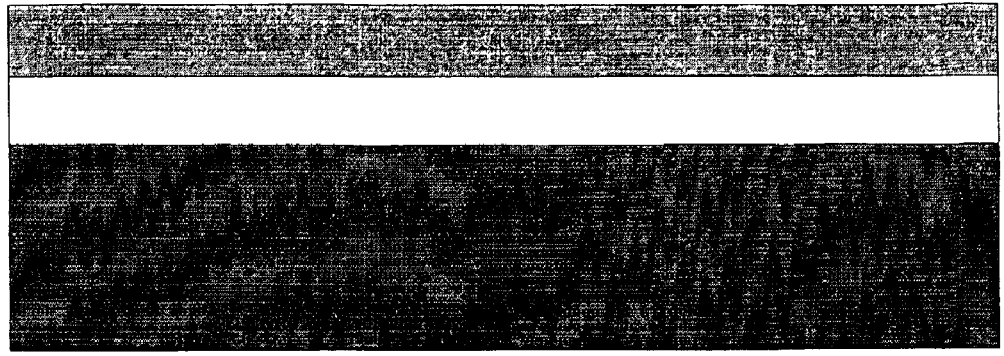
FIG. 1 is a schematic of the typical prior art wafer structure in which layer 1 is the top silicon layer, layer 2 is the BOX or insulator layer and layer 3 is the substrate.
Figure 2:
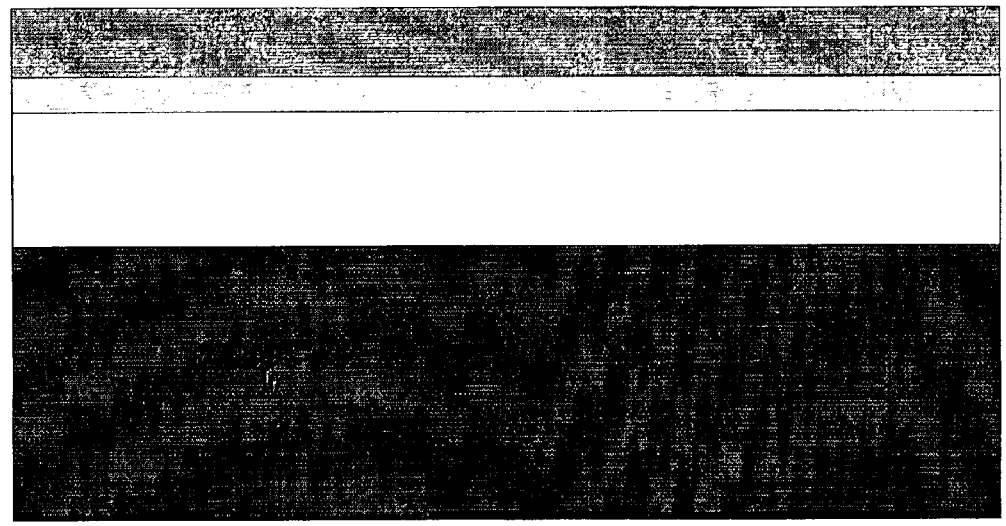
FIG. 2 is a schematic of one wafer structure of the present invention in which Layer 4 is the top silicon layer or device layer, layer 5 is the buried oxide or insulator layer; layer 6 is the isotopically-enriched semiconductor material and layer 7 is the substrate.

In the naturally occurring form, silicon is composed of three stable isotopes; approximately 92.2% $^{28}$Si, 4.7% $^{29}$Si and 3.1% $^{30}$Si, which is roughly the composition of crystals and wafers used by the semiconductor industry. The presence of multiple isotopes contributes to phonon scattering which decreases the thermal conductivity of naturally occurring silicon.

Isotopically-enriched $^{28}$Si has been shown to have a thermal conductivity 60% to 600% higher than naturally occurring silicon as described in Capinski et al., *Thermal Conductivity of Isotopically-enriched Si*, Applied Physics Letters, v71, pp. 2109–11 (1997), and Ruf et al., *Thermal Conductivity of Isotopically-enriched Silicon*, Solid State Communications, v115, pp. 243–47 (2000), both of which are incorporated herein in their entirety by this reference. Isotopically-enriched means the silicon has a higher proportion of one of the isotopes of silicon than is present in naturally occurring silicon (e.g., it is composed of at least 98% $^{28}$Si).

Isotopically pure germanium has also demonstrated improved thermal conductivity over naturally occurring germanium crystals as described in Ozhogin et al, *Isotope Effects in the Thermal Conductivity of Germanium Single Crystals*, JETP Letters, Vol. 63, No. 6, pp490–494, (1996), and in Asen-Palmer et al, *Thermal Conductivity of Germanium Crystals with different Isotopic Compositions*, Physical Review B, Vol. 56, No. 15, pp 9431–9447, (1997) incorporated herein in its entirety by this reference. In the case of germanium, isotopically-enriched means the enriched germanium has a higher proportion of one of the isotopes of Ge than is present in naturally occurring germanium (e.g., it is composed of at least 80% $^{74}$Ge).

Higher thermal conductivity means devices fabricated from the high thermal conductivity wafer exhibit lower peak temperatures, faster device speeds and higher frequency performance than previous, conventional wafers. Lower temperatures will result in higher carrier mobility and reduced leakage currents which result in lower heat generation within the material. In addition, higher thermal conductivity means that it is possible to increase device packing densities within integrated circuit chip designs and to increase power output per unit area of power devices. Furthermore, the invention has applicability in device structures such as semiconductor laser arrays, microelectromechanical devices (MEMS), micro-opto-electromechanical devices (MOEMS), optical switches, light emitting diodes, and laser diodes which utilize silicon substrates or silicon layers primarily for heat dissipation. The use of the present invention in such cases improves the thermal performance of the devices.

Any electronic device which relies on silicon, germanium, or Si—Ge alloys can be enhanced by the use of components made from the enriched isotopes to the extent that they impart improved thermal conductivity. Examples of such devices include integrated circuits, lasers, and diodes as described in U.S. Pat. No. 5,144,409 which is incorporated herein in its entirety by this reference.

One embodiment of the present invention is a wafer structure having a substrate and an isotopically-enriched layer formed on one surface of the substrate. The isotopically-enriched layer is composed of isotopically-enriched silicon, isotopically-enriched germanium, isotopically-enriched silicon-germanium alloys or combinations and alloys thereof. The isotopically-enriched layer serves to provide increased heat dissipation for the device. The wafer structure can be fabricated by forming a single-crystal layer composed of isotopically-enriched semiconductor materials on a layer of silicon dioxide, silicon nitride or other electrically insulating materials. The isotopically-enriched semiconductor layer is formed as a layer on one surface of a substrate by means of epitaxial deposition, layer transfer, wafer bonding of an isotopically-enriched semiconductor wafer, or other methods well known to those skilled in the art of semiconductor wafer manufacture.

In another embodiment of the present invention, a substantially pure silicon isotope (e.g. having a purity of at least 95%, more preferably at least 98%, more preferably at least 99.5%, and most preferably at least 99.9% silicon-28) is formed as a thin layer on one surface of a natural silicon substrate by epitaxial deposition. The epitaxial layer can be formed by techniques well known to those skilled in the art, such as chemical vapor deposition, molecular beam epitaxy, vapor phase epitaxy, liquid phase epitaxy, atomic layer deposition, or physical vapor deposition techniques. Oxygen or nitrogen atoms are then implanted into the top silicon layer using a standard silicon implantation of oxides (SIMOX) process to produce a silicon dioxide/silicon nitride layer under the surface after an annealing step at a temperature in the range of about 1100° C. to about 1300° C. The resulting wafer structure has a silicon-28 top layer, a $^{28}$SiO$_2$ or $^{28}$Si$_3$N$_4$ layer, an underlying silicon-28 layer, and a natural silicon substrate. The starting silicon-28 epitaxial layer is preferably between about 0.5 and about 500 microns thick, depending on the heat removal required. A semiconductor device is formed in the top silicon-28 layer and the underlying silicon-28 layer acts a heat spreading layer to minimize the temperature build-up in the top device layer.

Another embodiment of the present invention provides a method of fabricating an isotopically-enriched semiconductor wafer in which two substrates having semiconductor layer on at least one surface, at least one of which is an isotopically-enriched semiconductor layer, are bonded together with an electrically-insulating layer between them. The substrate underlying the isotopically-enriched semiconductor layer is then removed to leave an isotopically-enriched layer bonded to the insulating layer on the remaining substrate. The final wafer structure consists of a natural or isotopically-enriched semiconductor device layer, an electrically-insulating layer, an isotopically-enriched semiconductor material and a substrate.

The top semiconductor material can be composed of two layers, one of pure silicon and a second layer of silicon-germanium alloy, and the bottom isotopically-enriched semiconductor material can be isotopically-enriched silicon to maximize thermal conductivity through the insulating layer. The first underlying substrate is substantially removed by means known to those skilled in the art including, for example, mechanical grinding, chemical etching, plasma etching, or a combination of these processes. The resulting semiconductor wafer produced by this method has a top semiconductor material layer that can be as thin or as thick as desired for electrical/device performance, and a second enriched semiconductor material layer that can be as thick as desired for thermal performance.

Another embodiment of the present invention is directed to a wafer structure including a substrate composed of an inexpensive material of suitable composition such as polycrystalline silicon, an electrically-insulating layer such as silicon dioxide, and an isotopically-enriched single-crystal silicon layer composed of at least 98% $^{28}$Si as a top layer. The isotopically-enriched semiconductor layer is formed as a layer on one surface of a natural silicon substrate by means of epitaxial deposition, this wafer is bonded to the polysilicon substrate material which has an oxidized surface, and the first natural silicon substrate is removed. Another fabrication method uses layer transfer technology, as described in U.S. Pat. Nos. 5,374,564, 6,391,740, 6,372,609, or 6,352,909, to bond a thin layer of a semiconductor material to a second wafer. The substrate is composed of one or more of a naturally-occurring single crystal or polycrystalline silicon substrate, or a silicon dioxide substrate in which the silicon may be naturally occurring silicon or an isotopically-enriched silicon. The silicon dioxide layer can be formed by thermal oxidation, chemical vapor deposition, or by oxygen implantation (SIMOX method). In one particularly preferred embodiment, an isotopically-enriched silicon layer is formed on a silicon dioxide layer on a natural silicon substrate.

What is claimed is:

1. A semiconductor wafer structure comprising:
    an isotopically-enriched semiconductor material layer on a first surface of silicon nitride; and
    a layer of semiconductor material having natural isotopic ratios on a second surface of said silicon nitride, said second surface opposite said first surface, wherein:
    said isotopically-enriched semiconductor material layer has a higher thermal conductivity than said layer of semiconductor material having natural isotopic ratios.

2. The wafer structure of claim 1, wherein the isotopically-enriched semiconductor material layer comprises a semiconductor material selected from the group consisting of isotopically-enriched silicon, isotopically-enriched germanium, silicon-germanium alloys and combinations and alloys thereof.

3. The semiconductor wafer structure of claim 1, wherein the isotopically-enriched semiconductor comprises silicon enriched to at least 98% $^{28}$Si.

4. The semiconductor wafer structure of claim 1, wherein the isotopically-enriched semiconductor comprises geranium enriched to at least 85% $^{74}$Ge.

5. The semiconductor wafer structure of claim 1, wherein the isotopically-enriched semiconductor comprises geranium enriched to at least 80% of one of the germanium isotopes.

* * * * *